United States Patent [19]

Miller

[11] Patent Number: 4,578,639

[45] Date of Patent: Mar. 25, 1986

[54] METERING SYSTEM FOR MEASURING PARAMETERS OF HIGH AC ELECTRIC ENERGY FLOWING IN AN ELECTRIC CONDUCTOR

[75] Inventor: Robert C. Miller, Penn Hills Township, Pa.

[73] Assignee: Westinghouse Electric Corp., Pittsburgh, Pa.

[21] Appl. No.: 585,483

[22] Filed: Mar. 2, 1984

[51] Int. Cl.[4] .................. G01R 21/06; G01R 15/06; G01R 15/07

[52] U.S. Cl. .................. 324/96; 324/126; 324/142

[58] Field of Search ............ 324/96, 126, 142, 72; 332/7.51; 356/368; 350/374

[56] References Cited

U.S. PATENT DOCUMENTS

| | | | |
|---|---|---|---|
| 3,590,374 | 6/1971 | Evans et al. | 324/96 |
| 3,675,125 | 7/1972 | Jaecklin | 324/96 |
| 3,746,983 | 7/1973 | Renz | 324/96 |
| 4,077,061 | 2/1978 | Johnston et al. | 364/483 |
| 4,182,983 | 1/1980 | Heinrich et al. | 324/142 |
| 4,232,264 | 11/1980 | Papp et al. | 324/96 |
| 4,255,018 | 3/1981 | Ulrich et al. | 324/96 |
| 4,295,094 | 10/1981 | Wilreker et al. | 324/96 |
| 4,413,230 | 11/1983 | Miller | 324/142 |

FOREIGN PATENT DOCUMENTS

| | | | |
|---|---|---|---|
| 58-153174 | 9/1983 | Japan | 324/96 |
| 515065 | 9/1976 | U.S.S.R. | 324/96 |

OTHER PUBLICATIONS

Braun, A., et al., "Optoelectronic Electricity Meter for High-Voltage Lines", IEEE Trans. on Instr. and Meas., vol IM-22, No. 4, Dec. 1973, pp. 394-399.

Bleys, C., "Floating Input, Optically Isolated, High-Voltage Measurement Probe", Rev. Sci., Instrum., vol. 47, No. 5, May 1976, pp. 621-623.

Pearce, J., "Optically Coupled High-Voltage Isolation Amplifier", Rev. Sci. Instrum., vol. 49, No. 11, Nov. 1978, pp. 1562-1564.

Erickson, D., "The Use of Fiber Optics for Communications Measurement and Control . . . ", IEEE Trans. on Power App. and Sys., vol. PAS-99, No. 3, May 1980, pp. 1057-1065.

Primary Examiner—Stewart J. Levy
Assistant Examiner—Stephen M. Baker
Attorney, Agent, or Firm—L. P. Johns

[57] ABSTRACT

Metering system for measuring parameters of high AC electric energy flowing in an electric conductor and characterized by separate current sensor means for generating separate polarized light outputs representative of voltage end current passing through a conductor, separate electronic means for receiving and transforming the voltage and current outputs into power, voltage, and current signals.

8 Claims, 8 Drawing Figures

METERING SYSTEM FOR MEASURING PARAMETERS OF HIGH AC ELECTRIC ENERGY FLOWING IN AN ELECTRIC CONDUCTOR

BACKGROUND OF THE INVENTION

1. Field of the Invention

This invention relates generally to AC electric metering systems including voltage and current sensing transducers for applying signals responsive to the current and voltage parameters of an electric energy quantity, and more particularly, it pertains to electronic circuits for measuring power, voltage and current of extra high voltage transmission lines using magneto-optic current transformers for sensing current, and a capacitor circuit for providing voltage signals, voltage signals being proportional to the raate of change of voltage with respect to time.

2. Description of the Prior Art

The Faraday effect has been defined as existing when a plane polarized beam of light passes through certain transparent substances along the lines of a strong magnetic field, the plane of polarization of the emergent light is different from that of the incident light. The Faraday effect has been employed in the measurement of magnetic fields. However, its use for monitoring parameters of an electric current is less common, because the magnetic field arising from the current flow in an arbitrary circuit generally has a spatial variation. Suffice it to say, Faraday effect current sensors provide a high degree of linearity, good sensitivity, and excellent voltage isolation.

Examples of prior art patents generally disclosing the use of devices for AC electric energy measurement include U.S. Pat. Nos. 3,746,983; 4,077,061; 4,182,983; 4,232,264; and 4,413,230. It is the purpose of this invention to show how Faraday effect current sensors can be incorporated into a measuring system for monitoring power, voltage, current on an extra high voltage transmission line using a magneto-optic current transformer for current sensing and a capacitor to provide a signal representative of the voltage which signal is proportional to the rate of change of voltage with respect to time.

SUMMARY OF THE INVENTION

In accordance with this invention a metering system for measuring the parameters of high AC voltage energy flowing in an electric conductor is provided which comprises a magneto-optical material disposed to enclose a current-carrying conductor, polarizing means for putting polarized light into the magneto-optical material to rotate the plane of polarization of the light in response to current flowing in the conductor, analyzer means for converting the light from the polarizing means to an optical signal of varying intensity in response to the rotation produced in said material, means including fiber optic and detector means with associated electronic circuitry for providing a first electrical voltage output that is proportional to the current flowing in the conductor, circuit means including series-connected capacitors extending from the electric conductor to ground for generating a second voltage output that is proportional to the rate of change of line voltage with respect to time, electronic means for receiving input signals including the first voltage output and the second output which signals are converted to produce an output pulse representative of a quantitized amount of electrical energy carried by the conductor, integrator means for receiving the second voltage output from the circuit means and converting it into third voltage outputs, a first signal conditioner responsive to the third voltage output for converting them into conditioned voltage signals, and a second signal conditioner responsive to the first voltage output for converting them into conditioned current signals.

DESCRIPTION OF THE PREFERRED EMBODIMENT

Because of the voltage insulation inherent in sensors involving the Faraday effect, sensors are mounted directly on the high voltage transmission line with either a single turn or multiple turns through the window as determined by the rated line current. With existing Faraday effect materials it is desirable to have roughly 1,000 ampere-turns through the window and rated line current. The voltage would be measured with some form of a capacitive sensor. There are three applicable forms, each having special advantages of these sensors.

Figure 1:
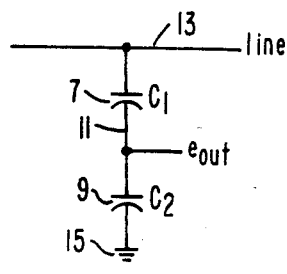
FIGS. 1, 2, and 3 are circuit diagrams of capacitive sensors.

A first form is a simple capacitive voltage divider consisting of two capacitors 7, 9 (FIG. 1) connected in series in a conductor 11 extending from a transmission line 13 to ground 15. An output voltage ($e_{out}$) extends from the conductor 11 as shown and is given by the formula I.

$$e_{out} = e_{line} \cdot \frac{C_1}{C_1 + C_2}$$

Since the line voltage is much larger than the desired output voltage, typically 0–10 volts, $C_2$ will be much larger than $C_1$. Further, since the line voltage is very high, $C_1$ is usually composed of a number of capacitors in series. A typical value of $C_1$ for a 115 KV rms line is 0.003 $\mu$f and for an output of 10 volts zero-peak $C_2$ is roughly 50 $\mu$f.

Figure 2:
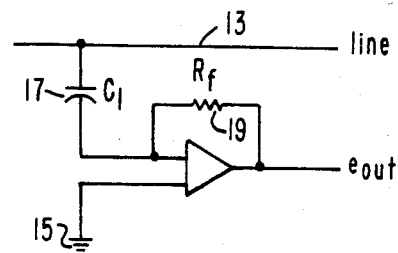

A second form of sensor provides a voltage output proportional to the current flowing through a capacitor 17 (FIG. 2) connected from the transmission line 13 to ground 15 as shown in FIG. 2. Since the current to the capacitor 17 is proportional to the rate of change of the line voltage with respect to time and the output of the OP amp is equal to the product of the input current and feedback resistor 19 ($R_f$), the following formula obtains:

$$e_{out} = R_f C \cdot de_{line}/dt.$$

Assuming a line voltage of 115 KV rms and $C_1$ equal to 0.003 $\mu$f, then for an output of 10 volts zeropeak, $R_f$ is 50 ohms.

Figure 3:
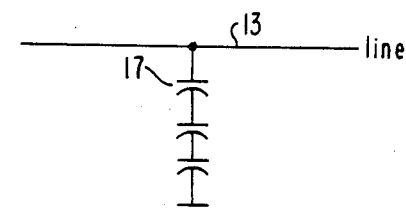
Figure 3:
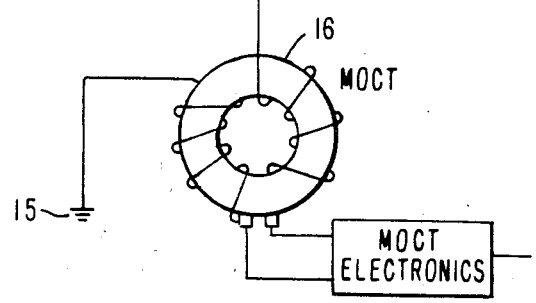

The third form of sensor (FIG. 3) likewise senses the current through a capacitor connected from line 13 to ground 15. However, in this case a closed form Faraday effect current sensor 16 is used to provide a signal proportional to the current. Since the current is small, 200 ma peak for the case of a 115 KV rms line and a 0.003 μfd capacitor, it is necessary to use a large number of turns through the window of the closed form sensor, for example, two thousand turns are employed to obtain a sample from the sensor.

The advantages of the three system are compared in Table 1.

TABLE 1

| Advantages | System 1 | System 2 | System 3 |
|---|---|---|---|
| Provides output proportional to line voltage (1) | Yes | No | No |
| Provides output proportional to de/dt (1) | No | Yes | Yes |
| Provides optical output (2) | No | No | Yes |
| Can be used with guarded capacitor (3) | Yes | Yes | With Difficulty |

Figure 4:
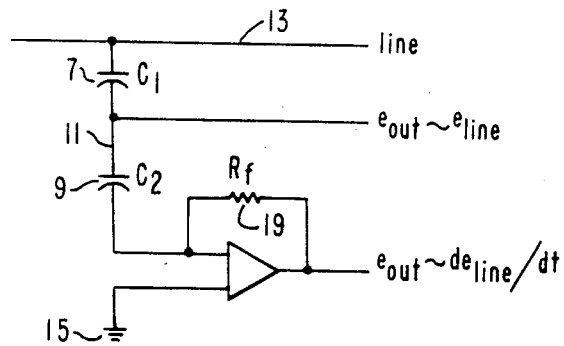
FIG. 4 is a circuit diagram of a combination of two outputs.

An output proportional to the line voltage (1) is desired for protection applications and an output proportional to the de/dt is desired for use with a solid-state watthour meter as disclosed in U.S. Pat. No. 4,182,983. It is possible to combine type 1 and 2 or type 1 and 3 systems to provide two outputs, one proportional to e and one proportional to de/dt. For example, type 1 and 2 systems are combined as shown in FIG. 4, where the conductor 11 extends from the line 13 to ground 15 and includes capacitors 7, 9 as well as a feedback resistor 19. This system may be employed when a single set of voltage and current sensors are used for both metering and protection. Alternately, an output proportional to e can be produced by integrating the signal proportional to de/dt.

Where high voltage and currents (2) are involved, optical outputs from both voltage and current sensors are desirable because of the immunity to electromagnetic interference of the optical outputs.

The use of guarded capacitors (3) would allow the use of smaller and possibly cheaper gas-filled capacitors.

Figure 5:
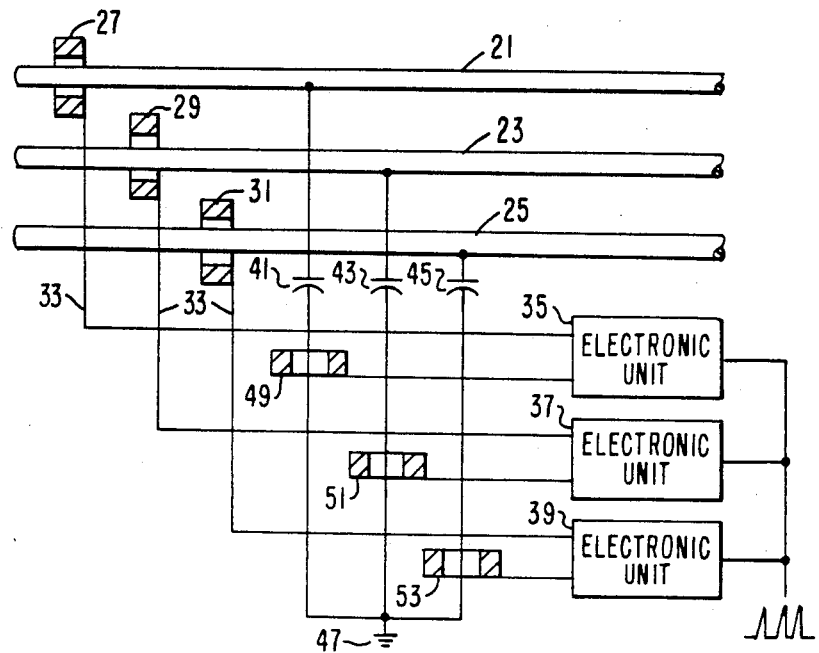
FIG. 5 is a schematic view of a three-phase four wire metering system.

In FIG. 5 a three-phase four wire metering system employing type 3 voltage sensors is shown schematically in which three high voltage conductors 21, 23, 25 are monitored by three Faraday effect current sensors 27, 29, 31 which are connected by similar fiber optic cables 33 to electronic units 35, 37, 39, respectively, such as solid-state watthour meters. Similarly, a circuit extends from each conductor 21, 23, 25 and includes sensing capacitors 41, 43, 45 which circuits extend to ground 47. Each capacitor circuit in turn is monitored by sensors 49, 51, 53, which are coupled with corresponding electronic units 35, 37, 39. Like the sensors 27, 29, 31, the sensors 49, 51, 53 are Faraday effect sensors, each with several thousand turns through the window to provide a signal proportional to the rate of change of the line voltage with respect to time. The electronic units 35, 37, 39 are preferably solid-state watthour meters, such as disclosed in U.S. Pat. No. 4,182,983, combined with preamps to convert the optical signals from the sensors 49, 51, 53 to analog electrical signals. The output of the preamp connected to each of the sensors 49, 51, 53 provides an electrical signal proportional to the current of the corresponding conductor which signal is connected to the voltage output of the electronics and the output of the preamp to provide an electrical signal proportional to the de/dt and is connected to the di/dt input of the electronics.

With these connections the electronics contained in one of the electronic units 35, 37, 39 provides an output whenever, $$\int_0^t e_1 \, i_1 \, dt$$

equals some predetermined number of wattseconds.

The total number of pulses from electronic unit 35, 37, 39 is proportional to the total power delivered by the line during the interval of time during which monitoring occurs.

In accordance with the Faraday effect, when a polarized light beam is transmitted through an optical material under the influence of a magnetic field, the rotation of the plane of polarization of the light beam, or the plane of vibration depending upon the definition used, is proportional to the strength of the magnetic field. Therefore, by detecting the amount of rotation of the polarized light beam which proceeds throughout the entire light path, the magneto-optical material which comprises the transformer 55 (FIG. 6) can be used as a means for measuring the amount of current in a transmission line 56. The magneto-optical material propagates the polarized light in a closed path about the conductor through the straight portions and corner portions.

Figure 6:
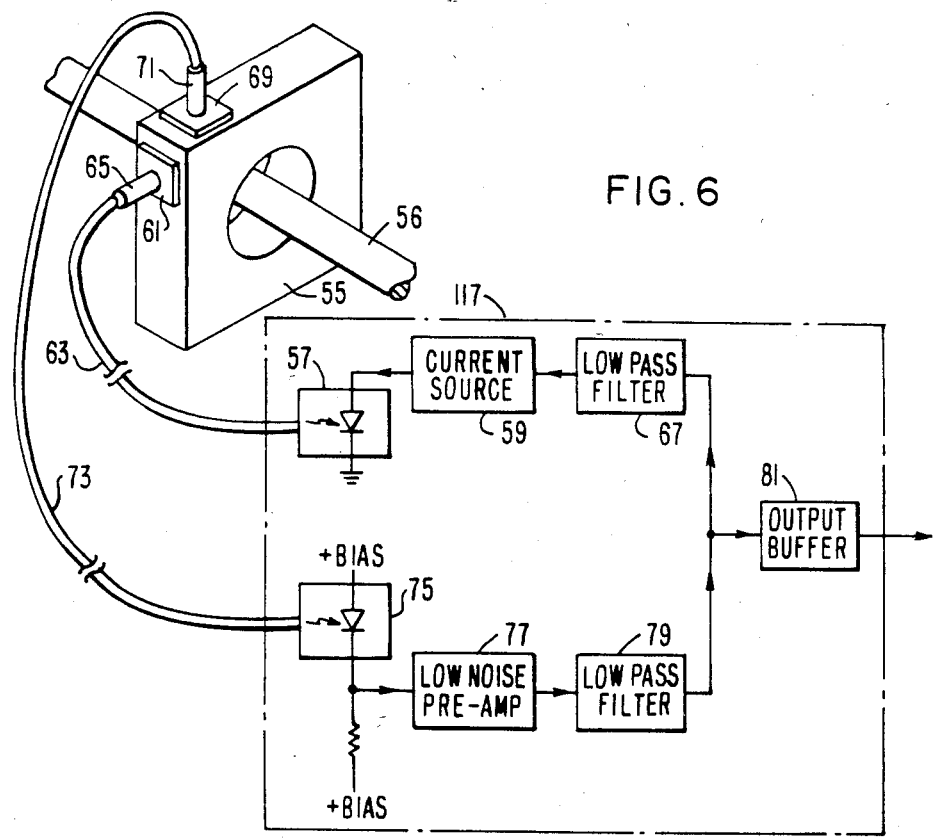
FIG. 6 is a diagrammatic view of the present magneto-optical current sensor with the supporting electronic circuitry shown schematically.

In FIG. 6, a complete system is shown diagrammatically for utilizing the present magneto-optical current sensor, such as the transformer 55. An LED light source 57 is biased by a current source 59 and is connected to an input polarizer 61 by a fiber optical cable 63 and a coupling or collimating lens 65. A low pass filter 67 limits the frequency response of the negative feedback loop. An output polarizer or analyzer 69 is oriented preferably at 45° with respect to the input polarizer 61. The output of the analyzer 69 has a coupling or collimating lens 71 and a fiber optical cable 73 connecting to the input of a photodiode 75. The photodiode 75 connects to a low noise preamplifier 77, a low pass filter 79 which determines the maximum frequency response of the sensor, and an output buffer 81 which serves to isolate the circuit from the output of the load. Parts 57, 59, 67, 75, 77, 79, 81 are designated as MOCT electronics 83 (FIG. 7).

Figure 7:
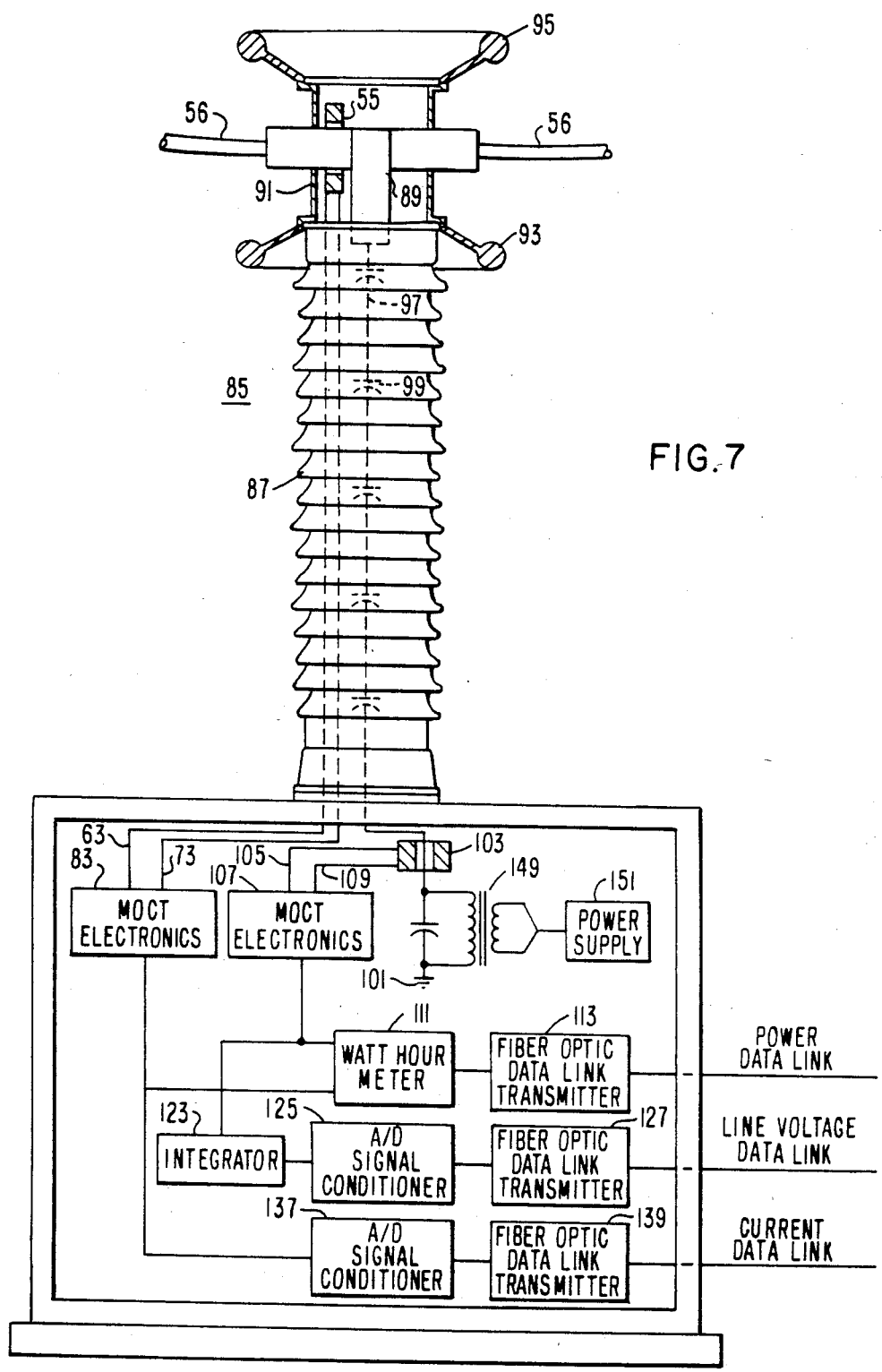
FIG. 7 is an elevational view of an insulating column for a power line.

An insulated high voltage column 85 is shown more particularly in FIG. 7 for supporting the power transmission line 56 at the upper end of an insulated bushing 87. The line 56 is supported by an electrical conducting member 89 for reinforcement which is secured in place within a housing 91. Corona rings 93, 95 are provided in a conventional manner.

In accordance with this invention a high voltage metering system with digital fiber optic link outputs for power, voltage, and current is provided and includes the magneto-optic current transformer 55 (FIG. 7), for measuring current signals through the line 56. The metering system also includes a conductor 97 having series connected capacitors 99 disposed therein for measuring voltage in the line 56.

The magneto-optic current transformer 55 is associated with means including fiber optic cables, a light source, and detector means with associated electronic circuitry for providing an electrical voltage output which is proportional to the current flowing in the line 56. The current transformer 55 comprises magneto-optical material, such as optical glass, that measures the amount of current flowing in the conductor by rotating polarized light which is transmitted via fiber optic cable 63 to the transformer 55 and then through a fiber optic cable 73 to the photodiode 75, whereby the reflected polarized light has a substantially zero relative phase change to accurately measure current in the line 56 using the Faraday effect. In this manner a current signal is transmitted from the transformer 55 from where it proceeds as a voltage output.

The circuit including conductor 97 with seriesconnected capacitors 99 extends from a bus bar 89 to ground 101. A magneto-optic current transformer 103, similar to transformer 55, encircles the conductor 97 and by fiber optic cable 105, light is transmitted from an electronic converter 107 to the transformer 103 and back through cable 109 to the converter 107 to generate a voltage signal which is proportional to the rate of change of line voltage with respect to time (dv/dt).

The voltage outputs from the converter 107 are fed into electronic means, such as a watthour meter 111, by which signals from the converters are converted to produce an output pulse representative of a quantitized amount of electrical energy. An example of such a meter is disclosed in U.S. Pat. No. 4,182,983 in which signals proportional to the line voltage e and the rate of change of line current respect to time (di/dt) are used as inputs. However, as used here, signals proportional to line current i and the rate of change of line voltage with respect to time (de/dt) are used as the corresponding inputs.

Figure 8:
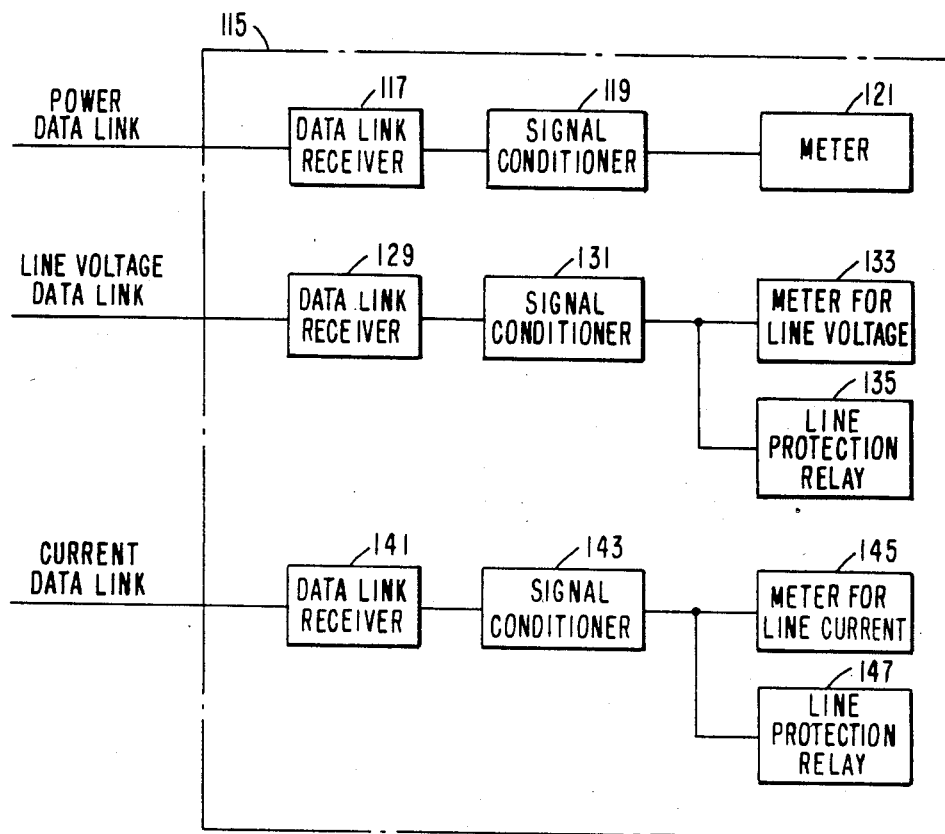
FIG. 8 is a schematic view of the solid state metering system in accordance with this invention.

From the meter 111 the output pulse is received by a data link transmitter 113 for converting the output pulse to an optical pulse. From there the optical pulse moves to a control center 115 (FIG. 8) where it passes through a data link receiver 117, a signal conditioner 119 and then to a meter 121 or register where a visible readout in the form of an energy parameter is displayed.

The voltage output (dv/dt) from the converter 107 is also received by an integrator 123 for converting voltage output from the converter 107 into a voltage signal which is transmitted to a signal conditioner 125 for conversion into a conditioned voltage signal from where it is communicated to a data link transmitter 127 such as of the fiber optic type for conversion to a binary coded optical signal which then moves to the control center 115 where it moves through a data link receiver 129, a signal conditioner 131 and to a meter 133 for providing a readout of the line voltage. In the alternative the signal may move from the signal conditioner 131 to a line protection relay 135.

The voltage output from the converter 83 is also received by a signal conditioner 137, such as an analog digital receiver, for converting the output voltage to a conditioned current signal from where it moves through a data link transmitter 139 for producing a binary coded optical signal from where it is conducted to the control center 115 where it enters a data link receiver 141, a signal conditioner 143, and to a meter 145 where the line current is visually displayed. In the alternative the signal from the signal conditioner 143 may be transmitted to a line protection relay 147.

In FIG. 7, the current flows through the capacitors 99 and through the window of the transformer 103, then through a power supply transformer 149 to ground. The secondary of the transformer 149 feeds power to a supply circuitry 151 for converting AC voltage to D.C. voltage with typically + and − 15 volts required for the components within the base of the column. In this manner, complete electrical isolation is provided between the components in the control center 115 which is a significant advantage.

What is claimed is:

1. A metering system for measuring the parameters of high voltage AC electric energy flowing in an electric conductor, comprising:
   (a) a magneto-optical material disposed to enclose a current-carrying conductor;
   (b) polarizing means for inputting polarized light into the magneto-optical material;
   (c) analyzer means for converting the light from the polarizing means to an optical signal of varying intensity in response to the rotation produced in said material;
   (d) means including fiber optic and detector means with associated electronic circuitry for providing a first electrical voltage output that is proportional to the current flowing in the conductor;
   (e) circuit means including series-connected capacitors extending from the electric conductor to ground and means for providing electrical voltage output which is proportional to electrical current flowing to and from the capacitors generating a second voltage output which is proportional to the rate of change of line voltage with respect to time;
   (f) electronic means for receiving input signals including the first voltage output and the second voltage output which is converted to produce an output pulse representative of a quantitized amount of electric energy carried by the conductor;
   (g) means for receiving the second voltage output from the circuit means and converting it into third voltage outputs;
   (h) a first signal conditioner responsive to the third voltage outputs for converting them into conditioned voltage signals; and
   (i) a second signal conditioner responsive to the first voltage output for converting it into conditioned current signals.

2. The system of claim 1 in which the signal conditioners are analog-digital converters.

3. The system of claim 2 in which fiber optic data links transmit optical signals from the electronic means including the analog-digital converters to provide a binary coded current signal which is transmitted through a data link receiver and a signal conditioner to meter means for displaying line current.

4. The system of claim 2 in which the electronic means comprises a solid-state watthour meter.

5. The system of claim 2 in which data link receiving and signal conditioning and meter means are optically connected through fiber optic cable to the electronic means including signal conditioners for converting the output pulse, the conditioned voltage signals, and the conditioned current signals into displayed quantities, and so as to provide analog signals for use in line protection relays.

6. The system of claim 5 in which the fiber optic cable comprises electrically insulating optic data links between the current-carrying conductor and the associated components.

7. The system of claim 2 in which the fiber optic data link transmit optical signals from the analog-digital converter through a data link receiver and a signal conditioner to meter means for displaying line voltage.

8. The system of claim 1 in which the output pulse is transmitted optically through a data link receiver and a signal conditioner to meter means for displaying energy parameters.

* * * * *